United States Patent [19]
Negishi et al.

[11] Patent Number: 5,250,825
[45] Date of Patent: Oct. 5, 1993

[54] SMEAR SUPRESSING CCD IMAGER

[75] Inventors: Michio Negishi, Kanagawa; Kazuya Yonemoto, Tokyo, both of Japan

[73] Assignee: Sony Corporation, Tokyo, Japan

[21] Appl. No.: 821,829

[22] Filed: Jan. 17, 1992

[30] Foreign Application Priority Data

Jan. 17, 1991 [JP] Japan ................................ 3-018237
Jan. 17, 1991 [JP] Japan ................................ 3-018239

[51] Int. Cl.$^5$ .................... H01L 29/796; H01L 27/14; H01L 31/00
[52] U.S. Cl. .................... 257/232; 257/231; 257/250; 257/435; 257/635
[58] Field of Search ............... 257/250, 435, 635, 637, 257/231–233

[56] References Cited
U.S. PATENT DOCUMENTS 5,028,972  7/1991  Watanabe et al. .................. 257/435

Primary Examiner—Gene M. Munson
Attorney, Agent, or Firm—Hill, Steadman & Simpson

[57] ABSTRACT

A CCD imager wherein signal charge can be transferred at a high speed and smears can be minimized without employing a complicated wiring configuration. The CCD imager comprises a transfer electrode formed from a semiconductor layer, a light intercepting film formed from a first layer metal film on the transfer electrode, and a shunt wiring film formed from a second layer metal film on the first layer metal film. The transfer electrode and the shunt wiring film are electrically connected to each other by way of the light intercepting film. Also an improved CCD imager of the frame interline type is disclosed wherein a storage section is improved in light intercepting performance to prevent possible occurrence of smears at the storage section with a simplified configuration of wiring in the storage section.

6 Claims, 3 Drawing Sheets

FIG. 5A  FIG. 5B
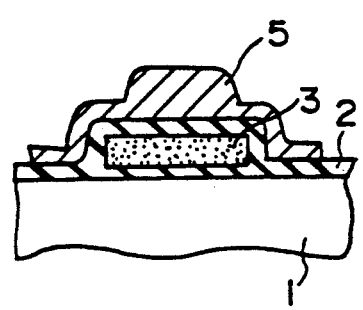
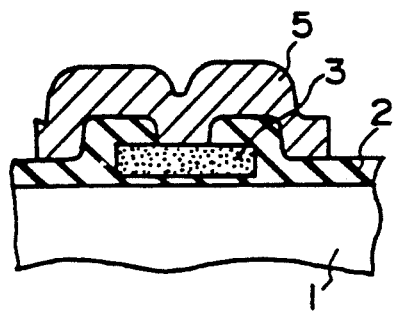
FIG. 5C
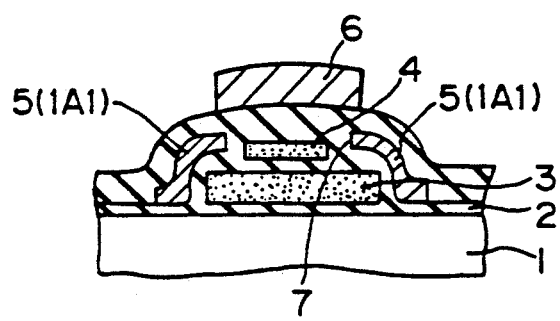
FIG. 6
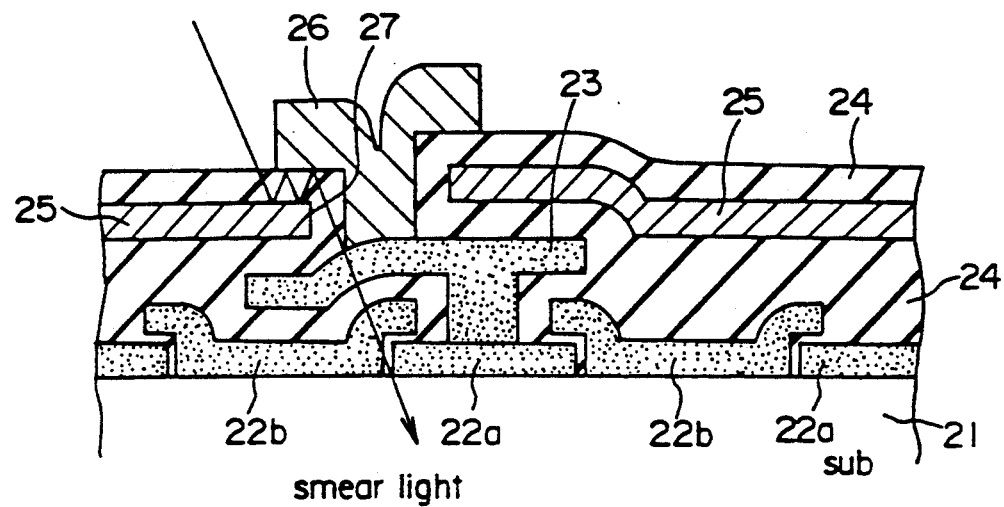
smear light

SMEAR SUPRESSING CCD IMAGER

BACKGROUND OF THE INVENTION

1. Field of the Invention

This invention relates to Smear Suppressing CCD imager, and more particularly to a CCD imager capable of transferring signal charge at a high speed and at a high smear suppressing ratio.

2. Description of the Prior Art

Various CCD (charge coupled device) imagers are already known and have been put into practical use. Different exemplary ones of such conventional imagers are shown in FIGS. 5(A), 5(B) and 5(C). Referring to FIGS. 5(A) to 5(C), reference numeral 1 denotes a semiconductor substrate, and 2 an interlayer insulating film made of, for example, PSG (phosphor silicate glass) for isolating a transfer electrode from a first aluminum layer 1Al. Reference numeral 3 denotes a transfer electrode formed from a first or second polycrystalline silicon layer, and 4 a buffer wiring film formed from a third polycrystalline silicon layer for preventing a potential shift by the first aluminum layer 1Al. Reference numeral 5 denotes the first aluminum layer 1Al, and 6 a second aluminum layer 2Al.

The CCD imager shown in FIG. 5(A) is a most popular one of CCD imagers for use for the NTSC color television system which are currently available on the market, and in such CCD imager, the first layer aluminum film 5 is used only as a light intercepting film. In the CCD imager, a portion of the first layer aluminum film 5 which protrudes from the transfer electrode 3 is reduced in thickness, and also a corresponding portion of the interlayer insulating film 2 is reduced in thickness. Since the interlayer insulating film 2 is reduced in thickness in this manner, possible smears can be reduced. This is because, since external light is repetitively reflected by and between the semiconductor substrate 1 and the first layer aluminum film 5, the thinner the interlayer insulating film 2, the greater the number of times by which such external light advancing in the interlayer insulating film 2 is reflected and the greater the amount of attenuation of light admitted into the transfer electrode 3.

It is to be noted that, since the CCD imager is constructed to match the NTSC color television system, it is not necessary to minimize the resistance of the transfer electrode in order to assure a high speed transferring operation, and consequently, the CCD imager does not include a shunt wiring film therein.

Meanwhile, the CCD imager shown in FIG. 5(B) is constructed such that the first layer aluminum film (1Al) 5 is used as a shunt wiring film and also as a light intercepting film so as to achieve a high speed transferring operation. The first layer aluminum film 5 has, from a point of view of minimization in resistance, a great thickness at a portion thereof which protrudes from the transfer electrode 3 as well as the other portion thereof which remains above the transfer electrode 5. Consequently, also the interlayer insulating film 2 has a great thickness. Otherwise, possible damage to the semiconductor substrate 1 upon etching for patterning of the aluminum film 5 cannot be prevented with the interlayer insulating film 2. In short, in order to prevent possible damage to the semiconductor layer 1, it is necessary for the interlayer insulating film 2 to have a thickness which increases in proportion to the thickness of the aluminum film 5.

On the other hand, the CCD imager shown in FIG. 5(C) is constructed such that the first layer aluminum film 5 is used as a light intercepting film while the second layer aluminum film 6 is used as a shunt wiring film. The buffer wiring layer 4 formed from a third layer of polycrystalline silicon is utilized to establish electric connection between the aluminum film 6 serving as a shunt wiring film and the transfer electrode 3. Such CCD imager is disclosed, for example, in Japanese Patent Laid-Open Application No. 2-87574.

Such CCD imager permits to reduce the thickness of the light intercepting film formed form the first layer aluminum film 5 and form the interlayer insulating film 2 with a reduced thickness and can reduce possible smears by such reduction in thickness of the interlayer insulating film 2. Further, high speed transfer is made possible by forming the second layer aluminum film 6 with a comparatively great thickness to reduce the resistance of a route of a transfer controlling signal. Particularly, such CCD imager can cope with the HDTV (high definition television) system having up to two million picture elements.

The conventional CCD imagers described above individually have different drawbacks. In particular, the CCD imager shown in FIG. 5(A) is disadvantageous in that high speed transfer cannot be achieved because it has no shunt wiring film, and accordingly, while it can cope with the NTSC color television system, it cannot cope with the high definition television system. Meanwhile, in the CCD imager shown in FIG. 5(B), the first layer aluminum film 5 must be formed at every portion thereof with a great thickness, which makes a corresponding great offset or step. Accordingly, the CCD imager is disadvantageous in that it is not suitable for miniaturization and is difficult to contribute to realization of a television set of the high definition television system which employs a ⅔ inch optical system CCD imager. Besides, since the interlayer insulating film 2 has a great thickness, it is difficult to suppress possible smears.

On the contrary, the CCD imager shown in FIG. 5(C) is superior in that a high speed transferring operation can be achieved and possible smears can be suppressed. However, the CCD imager is disadvantageous in that a wiring configuration is very complicated. This is because, since the first layer aluminum film 5 is used only as a light intercepting film, electric connection between the transfer electrode 3 and the second layer aluminum film 6 must be established through an opening formed in the aluminum film 5 serving as a light intercepting film. Further, since the wiring configuration is complicated, further miniaturization of cells is difficult. Since considerable miniaturization of cells is required in order for a CCD imager of a ⅔ inch optical system and further of a ½ inch optical system to cope with the high definition television system, it is a significant problem that the wiring configuration is complicated.

By the way, one of CCD imagers is a CCD imager of the frame interline type. A frame interline type CCD imager includes an image section including a large number of light receiving elements arranged in a matrix and a plurality of vertical registers provided for the columns of the light receiving elements for transferring signal charge accumulated in the light receiving elements in the vertical directions, and a storage section including a plurality of vertical registers provided at vertically transferring ends of the image section for temporarily storing therein signal charge generated from the image section.

Such frame interline type CCD imager is required to increase the number of picture elements to two million or so in order to cope with the high definition television system. To this end, two horizontal registers must be included as disclosed, for example, in Japanese Patent Publication Application No. 1-13767. Further, in order to reduce the resistance of a transfer electrode made of polycrystalline silicon, a shunt wiring film made of aluminum must be connected in parallel to the transfer electrode as disclosed, for example, in Japanese Patent Application No. 1-188558.

FIG. 6 shows a wiring structure of an exemplary one of conventional frame interline type CCD imagers for two million picture elements. Referring to FIG. 6, the frame interline type CCD imager shown includes a semiconductor substrate 21 and a pair of transfer electrodes 22a and 22b made of polycrystalline silicon. The transfer electrode 22a is made of first layer polycrystalline silicon 1Poly while the other transfer electrode 22b is made of second layer polycrystalline silicon 2Poly. The frame interline type CCD imager further includes a buffer wiring layer 23 made of third layer polycrystalline silicon 3Poly for electric the connection between the transfer electrode 22a and a shunt wiring layer 26. The buffer wiring layer 23 is provided to prevent a possible potential shift by first layer aluminum 1Al. An imager including a buffer wiring layer is disclosed in Japanese Patent Laid-Open Application No. 2-87574 as mentioned hereinabove. Originally, such third layer polycrystalline silicon 3Poly is a polycrystalline silicon layer necessitated for the formation of a gate provided between two horizontal registers to alternatively transmit signal charge from a storage section to a first or second one of the horizontal register in which such signal charge should subsequently be transferred horizontally. However, third layer polycrystalline silicon 3Poly forms, in an image section and the storage section, a buffer wiring layer which also effects a relaying or repeating operation.

The CCD imager further includes an interlayer insulating film 24, a light intercepting film 25 made of the first layer aluminum 1Al, and a shunt wiring film 25 made of second layer aluminum 2Al.

The CCD imager has, in either of the image section and the storage section, such a wiring structure as shown in FIG. 6.

However, while there is no specific problem if such wiring structure as shown in FIG. 6 is employed for the image section, there are some problems in employing, for the storage section, such a wiring structure as shown in FIG. 6 wherein a light intercepting film is formed from the first layer aluminum film 1Al while a shunt wiring film is formed from the second layer aluminum film 2Al. Thus, it is a first problem that a further high light intercepting characteristic cannot be obtained.

In particular, since a low speed shift of signal charge takes place in the storage section, a higher light intercepting performance than the OPB (optical black) of the storage section in which a high speed frame shift is performed is required. However, since the storage section has a same wiring structure as the image section, only a similar degree of light intercepting performance can be obtained. More particularly, it cannot be prevented completely that external light may be admitted into the inside while it is repetitively reflected by and between the first layer aluminum film (1Al) 25 and the second layer aluminum film (2Al) 26 as seen from FIG. 6 until it is introduced into a vertical transfer register to cause smears.

Secondly, where the light intercepting film is formed from the first layer aluminum film (1Al) and the shunt wiring film is formed from the second layer aluminum film (2Al), the opening 27 must be formed in the light intercepting film 25 such that the shunt wiring film 26 may be contacted with the buffer (transit) wiring film 23 through the opening 27, and it is a problem that the configuration is complicated. In particular, in the image section, since it includes the light receiving section and the vertical transfer section, even if the configuration is complicated, it still is necessary to form a light intercepting film from the first layer aluminum film (1Al) 25 and form a shunt wiring film from the second layer aluminum film (2Al) 26. However, in the storage section, there is no necessity of employing such complicated configuration as described above since it has no light receiving section but only has the vertical transfer section. Nevertheless, in the conventional CCD imager, the storage section is constructed in a complicated configuration similarly to the image section. This is not preferable because it will cause deterioration in reliability and reduction in yield in manufacture of CCD imagers.

SUMMARY OF THE INVENTION

It is an object of the present invention to provide a CCD imager wherein signal charge can be transferred at a high speed and smears can be minimized without employing a complicated wiring configuration.

It is another object of the present invention to provide a CCD imager wherein a storage section is improved in light intercepting performance to prevent possible occurrence of smears at the storage section with a simplified configuration of wiring in the storage section.

In order to attain the objects, according to one aspect of the present invention, there is provided a CCD imager, which comprises a transfer electrode formed from a semiconductor layer, a light intercepting film formed from a first layer metal film on the transfer electrode, and a shunt wiring film formed from a second layer metal film on the first layer metal film, the transfer electrode and the shunt wiring film being electrically connected to each other by way of the light intercepting film.

With the CCD imager, the light intercepting film formed from the first layer metal film relays or repeats the transfer electrode and the shunt wiring film to each other, and consequently, the transfer electrode and the shunt wiring film which is formed from the second layer metal film need not be connected to each other through an opening formed in the light intercepting film formed from the first layer metal film. Consequently, the wiring configuration is simplified.

Further, since the light intercepting film formed from the first layer metal film is connected to the shunt wiring film and contributes to reduction in resistance of a line for a transfer controlling signal, a transferring operation at a high speed can be achieved.

Preferably, the shunt wiring film has a film thickness greater than the film thickness of the light intercepting film.

Preferably, the transfer electrode and the light intercepting film are electrically connected to each other in a region different from another region in which the light intercepting film and the shunt wiring film are electrically connected to each other.

The CCD imager may further comprise a buffer electrode formed on the transfer electrode, the transfer electrode and the light intercepting film being electrically connected to each other by way of the buffer electrode.

The CCD imager can be manufactured by a process which comprises the steps of forming a transfer electrode, forming a light intercepting film above the transfer electrode, forming an interlayer insulating film on the light intercepting film, etching back the interlayer insulating film until an upper face of the light intercepting film is exposed, and forming a shunt wiring layer on the upper face of the light intercepting film.

According to another aspect of the present invention, there is provided a CCD imager of the frame interline type, which comprises an image section in which a light intercepting film is formed from a first layer metal film on a transfer electrode and a shunt wiring film is formed from a second layer metal film on the first layer metal film, and a storage section in which a shunt wiring film is formed from a first layer metal film on a transfer electrode and a light intercepting film is formed from a second layer metal film on the first layer metal film.

With the CCD imager of the frame interline type, since the light intercepting film in the storage section is located above the shunt wiring film, the storage section can be covered entirely with the light intercepting film. Accordingly, the light intercepting performance of the storage section can be improved, and possible smears at the storage section can be eliminated substantially completely.

Further, again since the light intercepting film in the storage section is located above the shunt wiring film, it is not necessary to connect the shunt wiring film to the transfer electrode making use of an opening which must otherwise be formed in the light intercepting film. Accordingly, the wiring configuration of the storage section can be simplified, and consequently, the reliability is improved and the yield in manufacture of frame interline type CCD image pickup elements can be improved. Besides, miniaturization of cells is facilitated.

A buffer electrode may be formed on the transfer electrode in the storage section such that the transfer electrode and the shunt wiring film may be electrically connected to each other by way of the buffer electrode.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 5(A), 5(B) and 5(C) are similar views but showing different conventional CCD imagers; and FIG. 6 is a similar view but showing a storage section of a conventional CCD imager of the frame interline type.

DETAILED DESCRIPTION OF THE PREFERRED EMBODIMENTS

Figure 1:
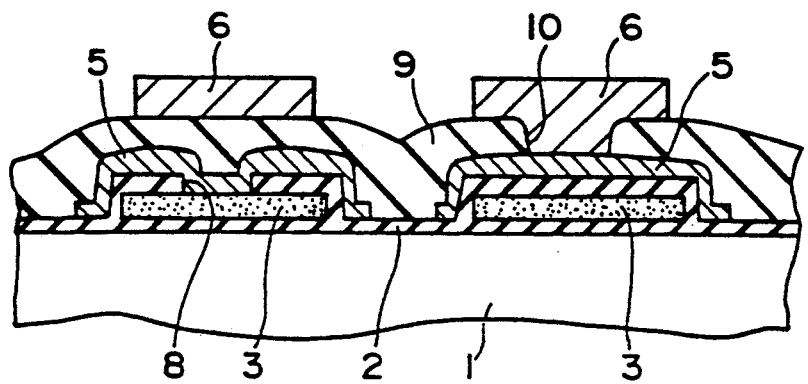
FIG. 1 is a sectional view of a CCD imager showing a preferred embodiment of the present invention.

Referring first to FIG. 1, there is shown a CCD imager to which the present invention is applied. The CCD imager shown includes a semiconductor substrate 1, and an interlayer insulating film 2 interposed between a transfer electrode 3 and a first layer aluminum film 5. The interlayer insulating film 2 has a comparatively small thickness in order to achieve reduction in production of smears. The transfer electrode 3 is formed from a polycrystalline silicon layer.

The first layer aluminum film (1Al) 5 serves as a light intercepting film and has a sufficient thickness necessary to achieve a function of intercepting external light, but does not have such a great thickness as the thickness of the first layer aluminum film 5 in the CCD imager shown in FIG. 5(B). Particularly, the first layer aluminum film 5 in the present embodiment has a thickness of, for example, 0.4 $\mu$m. The reason why the aluminum film 5 does not have a very great thickness is that it is intended to minimize the thickness of the interlayer insulating film 2. The thinner the first layer aluminum film 5, the smaller the thickness of the interlayer insulating film 2 as described hereinabove, and the interlayer insulating film 2 is minimized in thickness in order to reduce production of smears also as described hereinabove.

By the way, while the first layer aluminum film (1Al) principally is a light intercepting film, it is connected to the transfer electrode 3 or connected to the second layer aluminum film (2aL) serving as a shunt wiring film, and it also plays a roll of a transit or repeating wiring film between the transfer electrode 3 and the shunt wiring film. Hence, since the aluminum film 5 itself has a certain length and a certain width, while it is thin, it also plays a roll of a shunt wiring film.

The CCD imager has a contact portion 8 for electrically connecting the aluminum film 5 and the transfer electrode 3 to each other, and another contact portion 10 formed on an interlayer insulating film 9 for electrically connecting the aluminum film 5 and the shunt wiring film formed from the second layer aluminum film 6.

The aluminum film (2Al) 56 is formed with a sufficient thickness so as to play a roll of a shunt wiring film. Further, the first layer aluminum film 5 originally formed as a light intercepting film as described hereinabove also plays a roll of a shunt wiring film due to the fact that it plays a roll of a transit wiring film for relaying or repeating for the electric connection between the shunt wiring film 6 and the transfer electrode 3. Accordingly, the first layer aluminum film 5 contributes to reduction in resistance and increase in transfer speed although the degree of such contribution is not so high as the aluminum film 6 which is thicker than the first layer aluminum film 5.

The highest significance in that the first layer aluminum film 5 not only plays a roll of a light intercepting film but also plays another roll of a transit wiring film for relaying or repeating between the shunt wiring film 6 and the transfer electrode 3 resides in that the wiring structure can be simplified. In particular, since it is not necessary to form in the light intercepting film 5 an opening through which the shunt wiring film and the transfer electrode are electrically connected to each other, such a complicated wiring structure as that of the CCD imager shown in FIG. 5(C) need not be adopted. Accordingly, further miniaturization can be achieved.

Thus, with the present CCD imager, reduction in smear can be achieved similarly to the CCD imager shown in FIG. 5(C), and an increase in transfer speed with respect to that of the CCD imager shown in FIG. 5(C) can be achieved. Besides, the wiring structure can be simplified comparing with the CCD image pickup element shown in FIG. 5(C).

Figure 2:
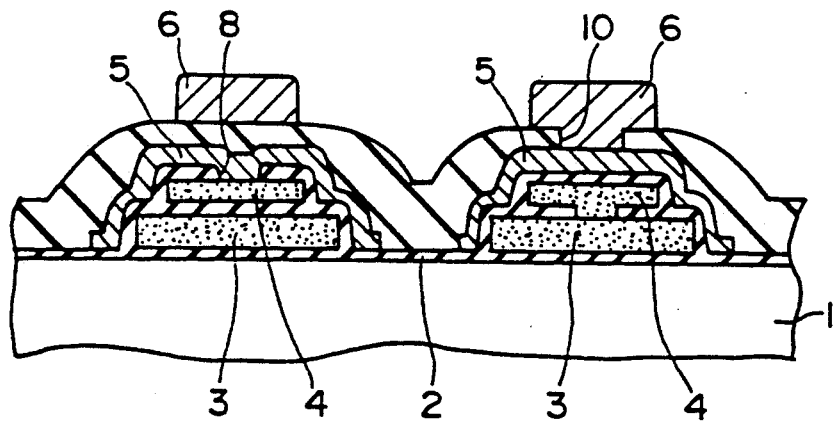
FIG. 2 is a similar view but showing another preferred embodiment of the present invention.

Referring now to FIG. 2, there is shown a CCD imager according to a second preferred embodiment of the present invention. The present CCD image pickup element is applied to such a CCD image pickup element of the type wherein a buffer polycrystalline silicon layer 4 is interposed between a first layer aluminum film 1Al and a transfer electrode for preventing a possible potential shift by the first layer aluminum film 1Al as disclosed in Japanese Patent Laid-Open Application No. 2-87574. Accordingly, a first layer aluminum film 5 in the present CCD imager is connected to the transfer electrode 3 by way of the buffer polycrystalline silicon film 4. Meanwhile, a shunt wiring film 6 is connected directly to the transfer electrode 3. It is to be noted that the buffer polycrystalline silicon layer 4 is formed from a third or fourth layer polycrystalline silicon film.

Figure 3:
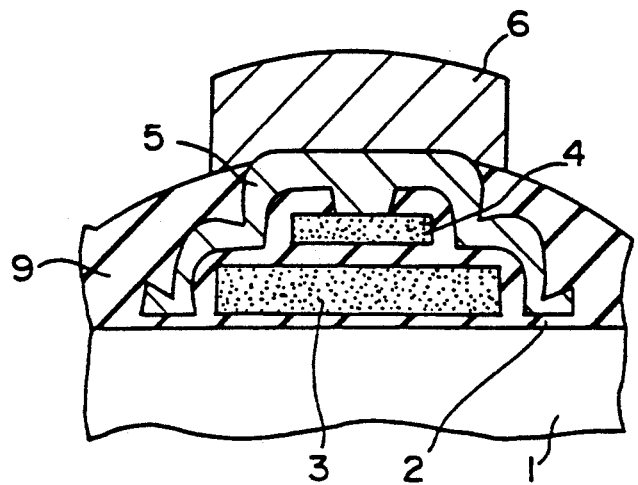
FIG. 3 is a similar view but showing a further preferred embodiment of the present invention.

Referring now to FIG. 3, there is shown a CCD imager according to a third preferred embodiement of the present invention. The present CCD imager is a modification to the CCD imager shown in FIG. 2 and is only different in that the light intercepting film 5 formed from the first aluminum film 1Al and serving also as a transit wiring film and a shunt wiring film and the shunt wiring film 6 formed from the second layer aluminum film 2Al are contacted directly with each other but not through a contact hole.

The construction is employed in order to eliminate a masking step of forming a contact hole for the connection the between the light intercepting film 5 and the shunt wiring film 6 thereby to decrease the number of steps in manufacturing the CCD imager.

In particular, originally, with the CCD imagers shown in FIGS. 1 and 2, the first layer aluminum film 5 and the second layer aluminum film 6 above the first layer aluminum film 5 have an equal potential, and such equal potential at both of such aluminum films is possible not only with the image section but also with a peripheral circuit or the like. Accordingly, the interlayer insulating film 9 for isolating the first and second layer aluminum films 5 and 6 from each other is not required to have a voltage resisting property but is only required to have a certain flatness. A highest one of offsets or steps which appear at a stage after formation of a first layer aluminum film appears at an upper face of such first layer aluminum film in either of an image section and a storage section. The upper face of such first layer aluminum film is nothing but a region at which the second layer aluminum film is to be connected to the first layer aluminum film.

Thus, when the interlayer insulating film 9 is formed and then is to be etched back for the object of flattening thereof, it is etched back until the upper face of the first aluminum film 5 is exposed, and after then, the second layer aluminum film (2Al) 6 is formed. Consequently, a series of steps required to form a contact portion on the interlayer insulating film 9 can be eliminated.

It is to be noted that some CCD imagers may possibly be produced such that, while a contact must be assured between the first layer aluminum film and the second layer aluminum film, there is no offset or step like an image section or an aluminum film and consequently, upon etching back of the interlayer insulating film 9, the upper face of the first layer aluminum film is not exposed. Thus, in such an instance, a suitable dummy pattern made of polycrystalline silicon is formed to compulsorily produce an offset or step so as to expose, upon etching back of the interlayer insulating film, the upper face of the first layer aluminum film. Further, since such dummy pattern can be formed simultaneously with a transfer electrode made of polycrystalline silicon or a buffer polycrystalline silicon film, no increase in number of steps is involved.

Thus, the practical convenience in employment of such structure as shown in FIG. 3 to eliminate a contact portion forming step is high in that it can significantly contribute to reduction in production cost.

Figure 4:
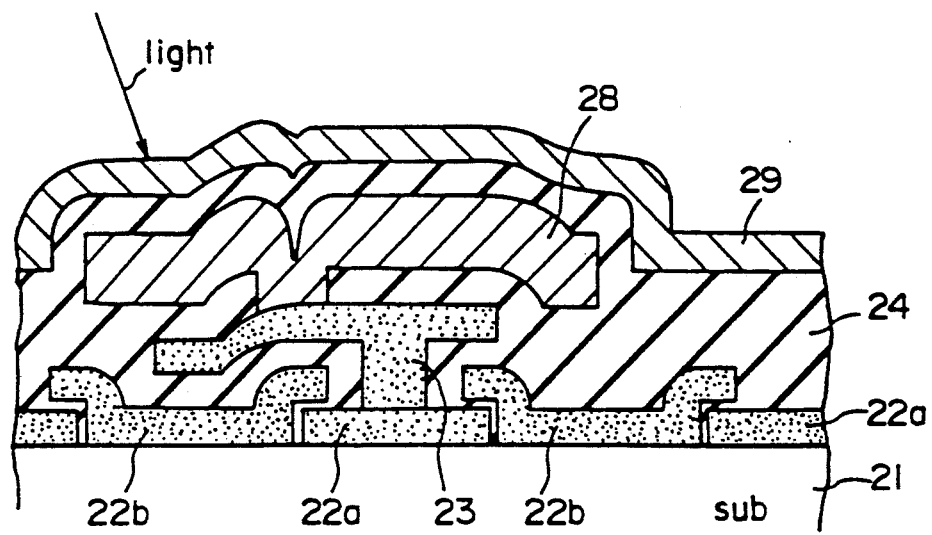
FIG. 4 is a similar view but showing a still further preferred embodiment of the present invention.

Referring now to FIG. 4, there is shown a storage section of a CCD imager of the frame interline type according to a fourth preferred embodiment of the present invention. The frame interlayer type CCD imager of the present embodiment has a somewhat common structure to the conventional CCD imager described hereinabove with reference to FIG. 6 except a characteristic thereof that the wiring configuration of a storage section is such that a shunt wiring film is formed form a first layer aluminum film 1Al while a light intercepting film is formed from a second layer aluminum film 2Al. Since such common structure is described hereinabove, only such characteristic will be described below.

The storage section of the frame interline type CCD imager includes a shunt wiring film 28 formed from the first layer aluminum film 1Al and connected to a transfer electrode, for example, a transfer electrode 22a by way of a buffer (transit) wiring film 23 formed from a third polycrystalline silicon layer.

the storage section further includes a light intercepting film 29 formed form the second layer aluminum film 2Al such that it completely covers over the storage section to completely prevent incidence of light to the storage section.

It is to be noted that the wiring configuration of an image section of the frame interline type CCD imager of the present embodiment is not shown in the drawings because it is similar to that of the conventional frame interline type CCD image pickup element described hereinabove. In particular, the image section has such a wiring structure as shown in FIG. 6 wherein a light intercepting film is formed from a first layer aluminum film 1Al while a shunt wiring film is formed from a second layer aluminum film 2Al.

With the frame interline type CCD imager having such construction as described above, since the entire area of the storage section is covered completely with the light intercepting film 29 formed from the second layer aluminum film (2Al), the storage section can be isolated completely from external light. In other words, the light intercepting performance of the storage section can be made higher than that of the OPB of the image section to completely eliminate smears.

Further, in the storage section, the shunt wiring film 28 is located below the light intercepting film 29, and the necessity for the connection of the shunt wiring film 28 to the buffer wiring film 23 through an opening in the light intercepting film 29 as is required for the conventional CCD imager described hereinabove is eliminated.

Consequently, the configuration is simplified. Accordingly, the reliability is improved and the yield in manufacture of CCD imagers is improved, and besides, miniaturization of cells is facilitated.

It is to be noted that the present invention can be applied also to a frame interline type CCD imager of the type which does not include a buffer wiring film formed, for example, from third layer polycrystalline silicon. In this instance, the light intercepting film 29 will be connected directly to the transfer electrode 22a or 22b.

Having now fully described the invention, it will be apparent to one of ordinary skill in the art that many changes and modifications can be made thereto without departing from the spirit and scope of the invention as set forth herein.

What is claimed is:

1. A CCD imager, comprising:
   a transfer electrode formed from a semiconductor layer;
   a light intercepting film formed from a first layer metal film on said transfer electrode; and
   a shunt wiring film formed from a second layer metal film on said first layer metal film;
   said transfer electrode and said shunt wiring film being electrically connected to each other by way of said light intercepting film.

2. A CCD imager according to claim 1, wherein said shunt wiring film has a film thickness greater than the film thickness of said light intercepting film.

3. A CCD image according to claim, 1 wherein said transfer electrode and said light intercepting film are electrically connected to each other in a region different from another region in which said light intercepting film and said shunt wiring film are electrically connected to each other.

4. A CCD imager according to claim 1, further comprising a buffer electrode formed on said transfer electrode, said transfer electrode and said light intercepting film being electrically connection to each other by way of said buffer electrode.

5. A CCD imager of the frame interline type, comprising an image section in which a light intercepting film is formed from a first layer metal film on a transfer electrode and a shunt wiring film is formed from a second layer metal film on said first layer metal film, and a storage section in which a shunt wiring film is formed from a first layer metal film on a transfer electrode and a light intercepting film is formed from a second layer metal film on said first layer metal film.

6. A CCD imager of the frame interline type according to claim 5, wherein, in said storage section, a buffer electrode is formed on said transfer electrode such that said transfer electrode and said shunt wiring film are electrically connected to each other by way of said buffer electrode.

* * * * *